(12) United States Patent
Liao

(10) Patent No.: US 12,557,406 B2
(45) Date of Patent: Feb. 17, 2026

(54) PHOTONIC STRUCTURE AND METHODS OF MANUFACTURING

(71) Applicant: Taiwan Semiconductor Manufacturing Company, Ltd., Hsinchu (TW)

(72) Inventor: Shih-Yu Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 352 days.

(21) Appl. No.: 18/447,078

(22) Filed: Aug. 9, 2023

(65) Prior Publication Data

US 2025/0056906 A1    Feb. 13, 2025

(51) Int. Cl.
*H10F 39/00* (2025.01)
*H10F 39/12* (2025.01)
*H10F 39/18* (2025.01)

(52) U.S. Cl.
CPC ....... *H10F 39/8033* (2025.01); *H10F 39/021* (2025.01); *H10F 39/182* (2025.01); *H10F 39/199* (2025.01)

(58) Field of Classification Search
CPC .... H10F 39/8033; H10F 39/021; H10F 39/80; H01L 27/1461; H01L 27/14694; H01L 27/14603; H01L 27/14607
See application file for complete search history.

(56) References Cited

U.S. PATENT DOCUMENTS

| 7,619,267 | B2 * | 11/2009 | Araki | H10F 39/1825 |
| | | | | 257/292 |
| 7,883,916 | B2 * | 2/2011 | Gambino | H10F 39/1825 |
| | | | | 438/57 |
| 11,398,522 | B2 | 7/2022 | Yamakawa | |
| 2018/0158856 | A1 | 6/2018 | Han et al. | |
| 2020/0168665 | A1 | 5/2020 | Joei et al. | |
| 2023/0126668 | A1 | 4/2023 | Emadi et al. | |
| 2025/0056905 | A1 * | 2/2025 | Liao | H10F 39/8023 |
| 2025/0063838 | A1 * | 2/2025 | Liao | H10F 39/1843 |
| 2025/0221091 | A1 * | 7/2025 | Liao | H10F 77/413 |

FOREIGN PATENT DOCUMENTS

CN    109937482 A    6/2019

* cited by examiner

*Primary Examiner* — Lauren R Bell
(74) *Attorney, Agent, or Firm* — Harrity & Harrity, LLP

(57) ABSTRACT

Some implementations described herein provide an optoelectronic device including a multi-layer photodiode structure having multiple sensing structures formed from one or more quantum effect materials (e.g., formed from multiple layers of quantum effect materials). The multiple sensing structures, which include sidewalls that are in contact with a substrate of the optoelectronic device, may be stacked and include overlapping portions. Through use of the multi-layer photodiode structure including the multiple sensing structures, a quantum length is increased relative to another photodiode structure including a single, planar sensing structure formed from a layer of a quantum effect material.

20 Claims, 21 Drawing Sheets

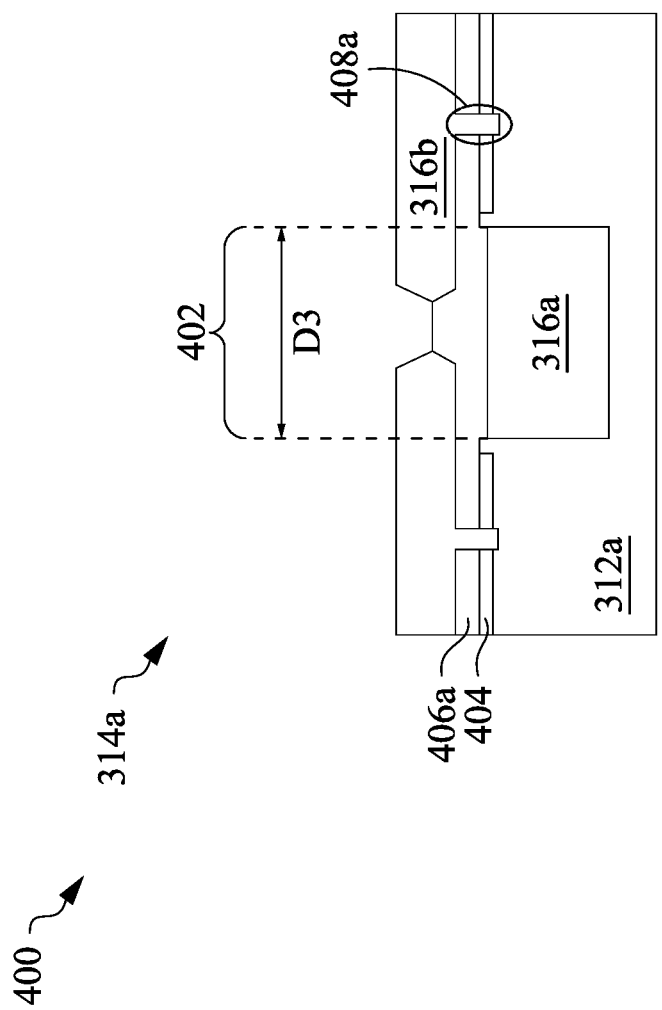

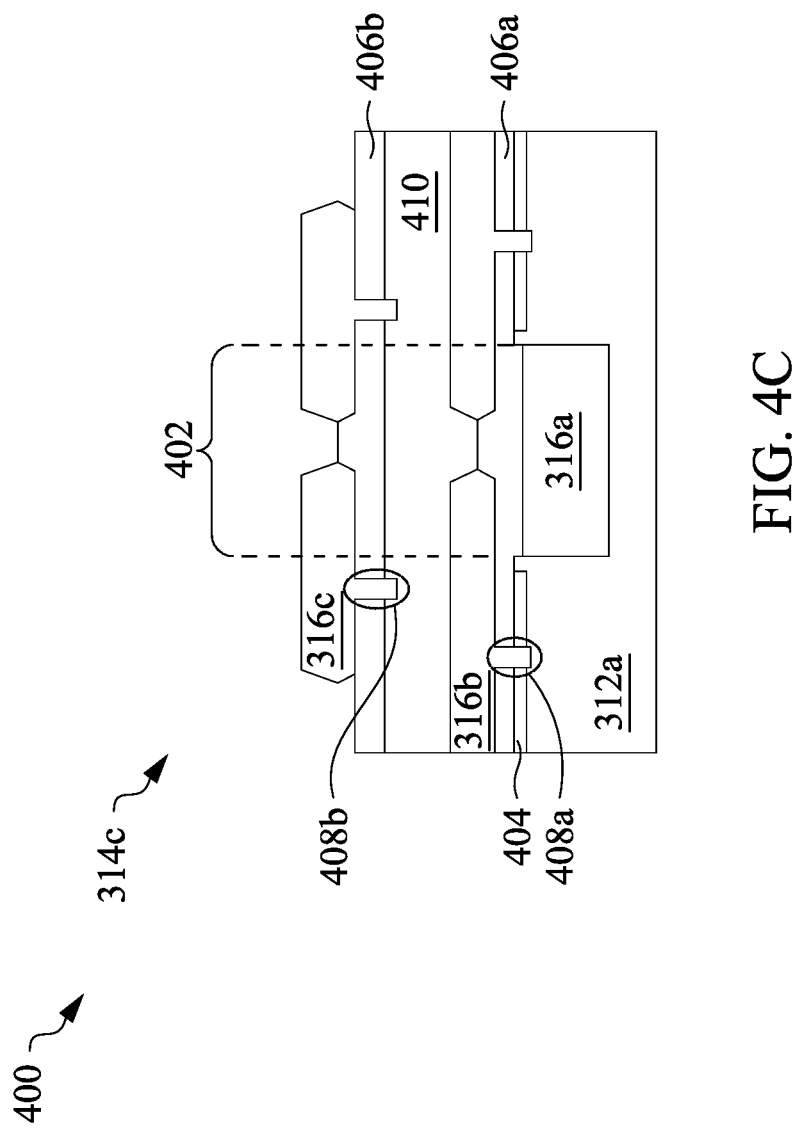

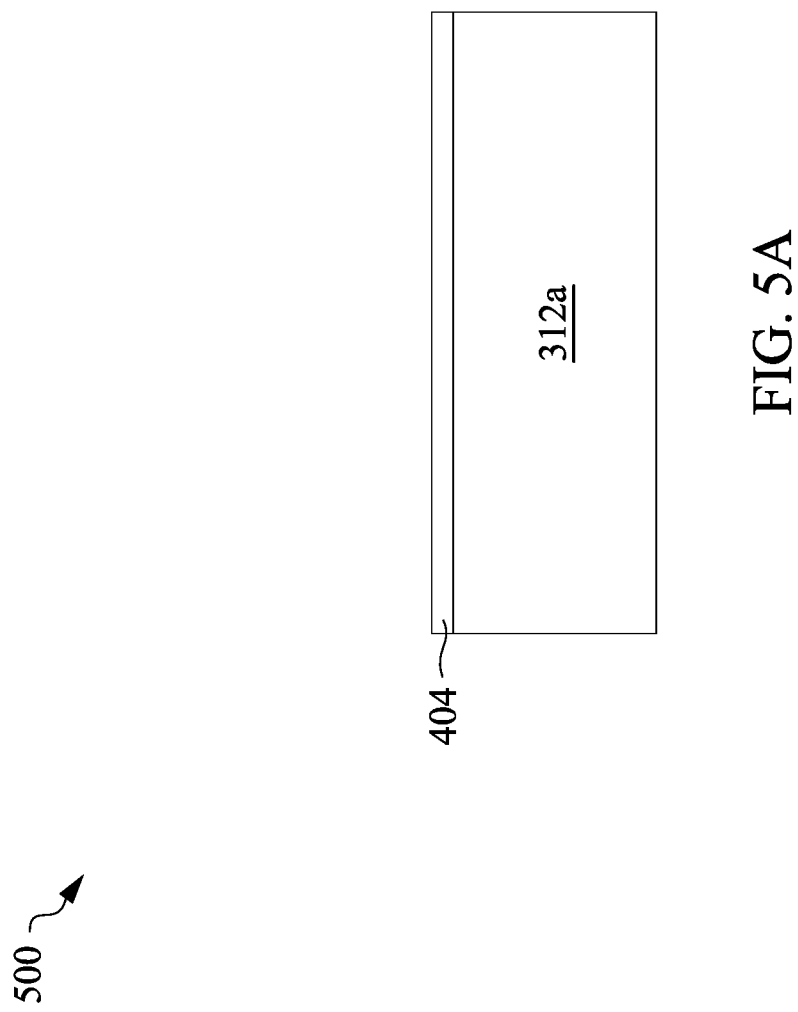

PHOTONIC STRUCTURE AND METHODS OF MANUFACTURING

BACKGROUND

Complementary metal oxide semiconductor (CMOS) image sensor (CIS) devices utilize light-sensitive CMOS circuitry to convert light energy into electrical energy. The light-sensitive CMOS circuitry may include a photodiode structure formed in a silicon substrate. As the photodiode structure is exposed to light, an electrical charge is induced in the photodiode structure (referred to as a photocurrent). The photodiode structure may be coupled to a switching transistor, which is used to sample the charge of the photodiode structure. Colors may be determined by placing filters over the light-sensitive CMOS circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A-4D are diagrams of example implementations of a multi-layer photodiode structure described herein.

FIGS. 5A-5L are diagrams of an example implementation described herein.

DETAILED DESCRIPTION

Figure 1:
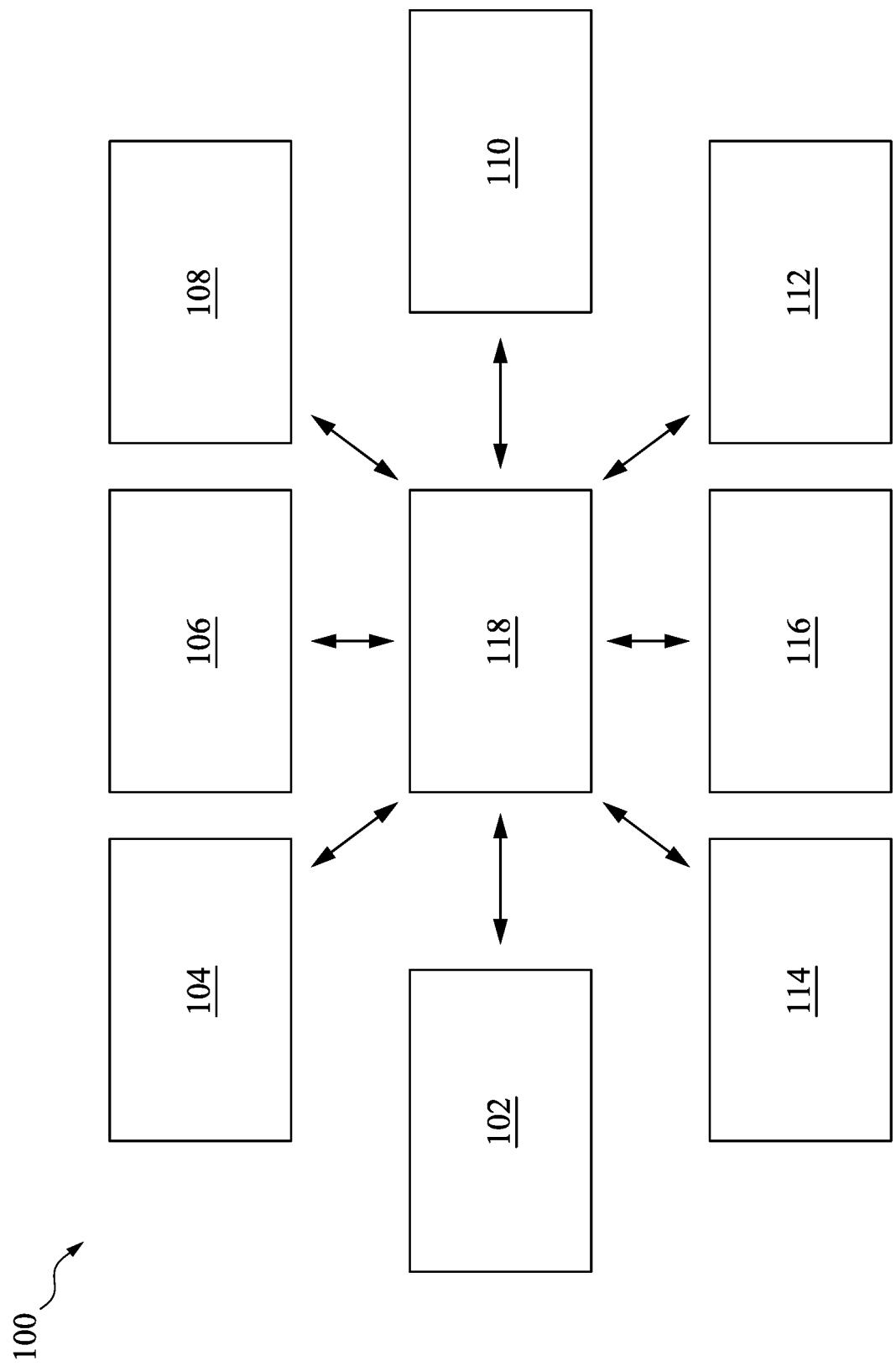
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases of an optoelectronic device, a photodiode structure includes a layer of a quantum material such as germanium. Photons from light entering the layer of the quantum material may be absorbed and create electron-hole pairs that are separated by the electric field across a p-n junction, generating a current (e.g., the photocurrent) that can be detected by an external circuit.

A thickness or a length of the layer of the quantum material, sometimes referred to as a "quantum length," can impact a performance of the photodiode structure. For example, if the quantum length of the layer of the quantum material is too short (e.g., the layer of quantum material is too thin), the photons from the light entering the layer of the quantum material may pass through the layer of the quantum material without being absorbed, thereby reducing a sensitivity and/or energy conversion efficiency of the photodiode structure.

Some implementations described herein provide an optoelectronic device including a multi-layer photodiode structure having multiple sensing structures formed from one or more quantum effect materials (e.g., formed from multiple layers of quantum effect materials). The multiple sensing structures, which includes a lower sensing structure having sidewalls that are in contact with a substrate of the optoelectronic device, may be stacked and include overlapping portions. Through use of the multi-layer photodiode structure including the multiple sensing structures, a quantum length is increased relative to another photodiode structure including a single, planar sensing structure formed from a layer of a quantum effect material.

In this way, a performance of an optoelectronic device including the multi-layer photodiode structure is increased relative to another optoelectronic device including a photodiode structure including the single, planar sensing structure. By improving the performance of the optoelectronic device, a quality and a reliability of the optoelectronic device for a target application and/or environment may increase to improve a manufacturing yield and reduce a rate of field failures. Improving the manufacturing yield and reducing the rate of field failures may reduce an amount of resources (e.g., raw materials, semiconductor manufacturing tools, labor, and/or computing resources) needed to support a market consuming the optoelectronic device.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding/debonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding/debonding tool 116 is a semiconductor processing tool that is capable of joining two or more wafers (or two or more semiconductor substrates, or two or more semiconductor devices) together. For example, the bonding/debonding tool 116 may include a eutectic bonding tool that is capable of forming eutectic bond between two or more wafers together. In these examples, the bonding/debonding tool 116 may heat the two or more wafers to form a eutectic system between the materials of the two or more wafers. As another example, the bonding/debonding tool 116 may include a hybrid bonding tool, a direct bonding tool, and/or another type of bonding tool. In some implementations, the bonding/debonding tool 116 may heat the two or more wafers to separate the two or more wafers.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

One or more of the semiconductor processing tools 102-116 and/or the wafer/die transport tool 118 may perform a series of one or more semiconductor processing operations described herein. In some implementations, and as an example, the series of one or more semiconductor processing operations includes forming a layer of an oxide material over a substrate. The series of one or more semiconductor processing operations includes forming a first cavity through the layer of the oxide material into the substrate. The series of one or more semiconductor processing operations includes forming a first sensing structure in the first cavity, where forming the first sensing structure includes forming sidewalls that are in direct contact with surfaces of the first cavity. The series of one or more semiconductor processing operations includes forming a layer of a dielectric material over the first sensing structure. The series of one or more semiconductor processing operations includes forming a recessed region within the layer of the dielectric material. The series of one or more semiconductor processing operations includes forming a second cavity through the layer of the dielectric material within the recessed region and through the layer of the oxide material to the substrate. The series of one or more semiconductor processing operations includes forming a second sensing structure that is over the recessed region and that includes a bottom-side protrusion filling the second cavity to connect with the substrate, where forming the second sensing structure includes forming the second sensing structure above the first sensing structure. In some implementations, one or more of the semiconductor processing operations performed by the semiconductor processing tools 102-116 and/or the wafer/die transport tool 118 may correspond to one or more semiconductor processing operations described in connection with FIGS. 5A-5L and elsewhere herein, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
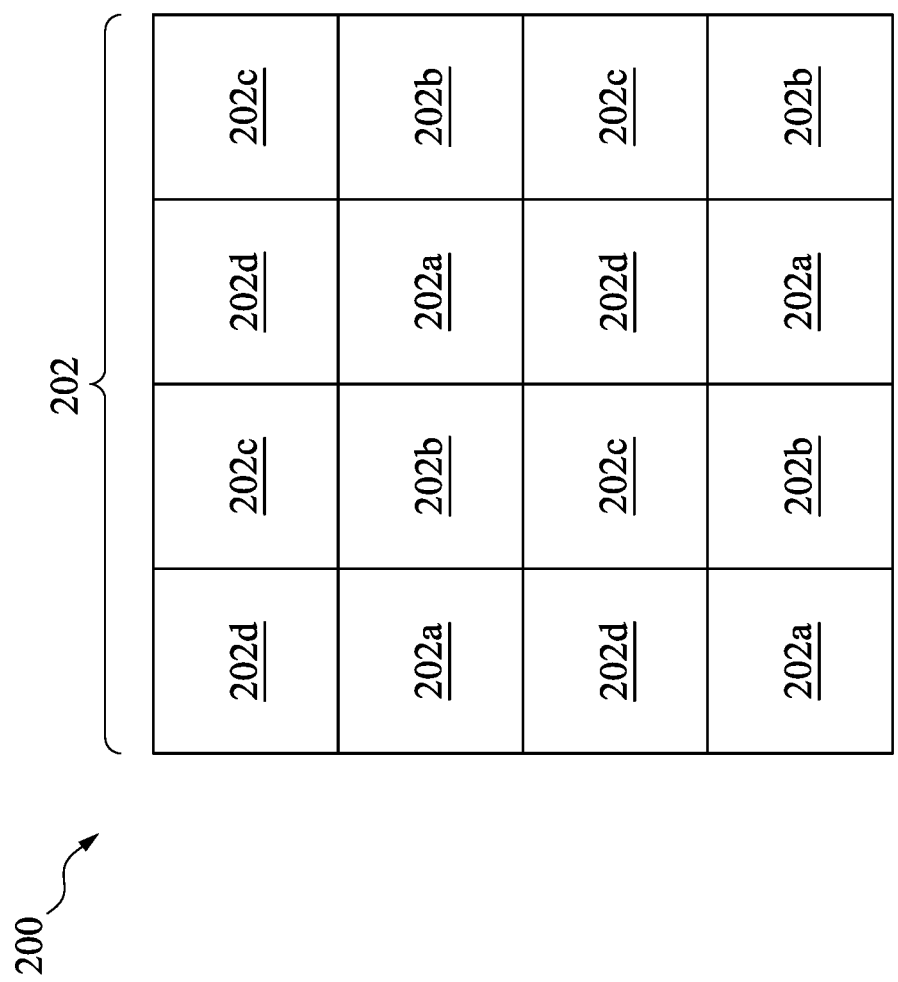
FIG. 2 is a diagram of an example semiconductor structure described herein.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode structure. The accumulation of photons in the photodiode structure may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As described in greater detail in connection with FIGS. 3-7 and elsewhere herein, the pixel sensors 202 may include a combination of light wave filters (e.g., light wave filters to filter targeted wavelengths of light). For example, and using the light wave filters, the pixel sensor 202a may include multi-layer photodiode structures that sense red VIS light waves (e.g., electromagnetic waves having wavelengths that are included in a range of approximately 620 nanometers to approximately 750 nanometers). Additionally, or alternatively, the pixel sensor 202b may include multi-layer photodiode structures that sense blue VIS light waves (e.g., electromagnetic waves having wavelengths that are included in a range of approximately 450 nanometers to approximately 495 nanometers). Additionally, or alternatively, the pixel sensor 202c may include multi-layer photodiode structures that sense green VIS light waves (e.g., electromagnetic waves having wavelengths that are included in a range of approximately 495 nanometers to approximately 570 nanometers). Additionally, or alternatively, the pixel sensor 202d may include multi-layer photodiode structures that sense NIR light waves (e.g., electromagnetic waves having wavelengths that are included in a range of approximately 750 nanometers to approximately 2500 nanometers).

As indicated above, FIG. 2 is provided as an example. Other examples may differ from what is described with regard to FIG. 2.

Figure 3:
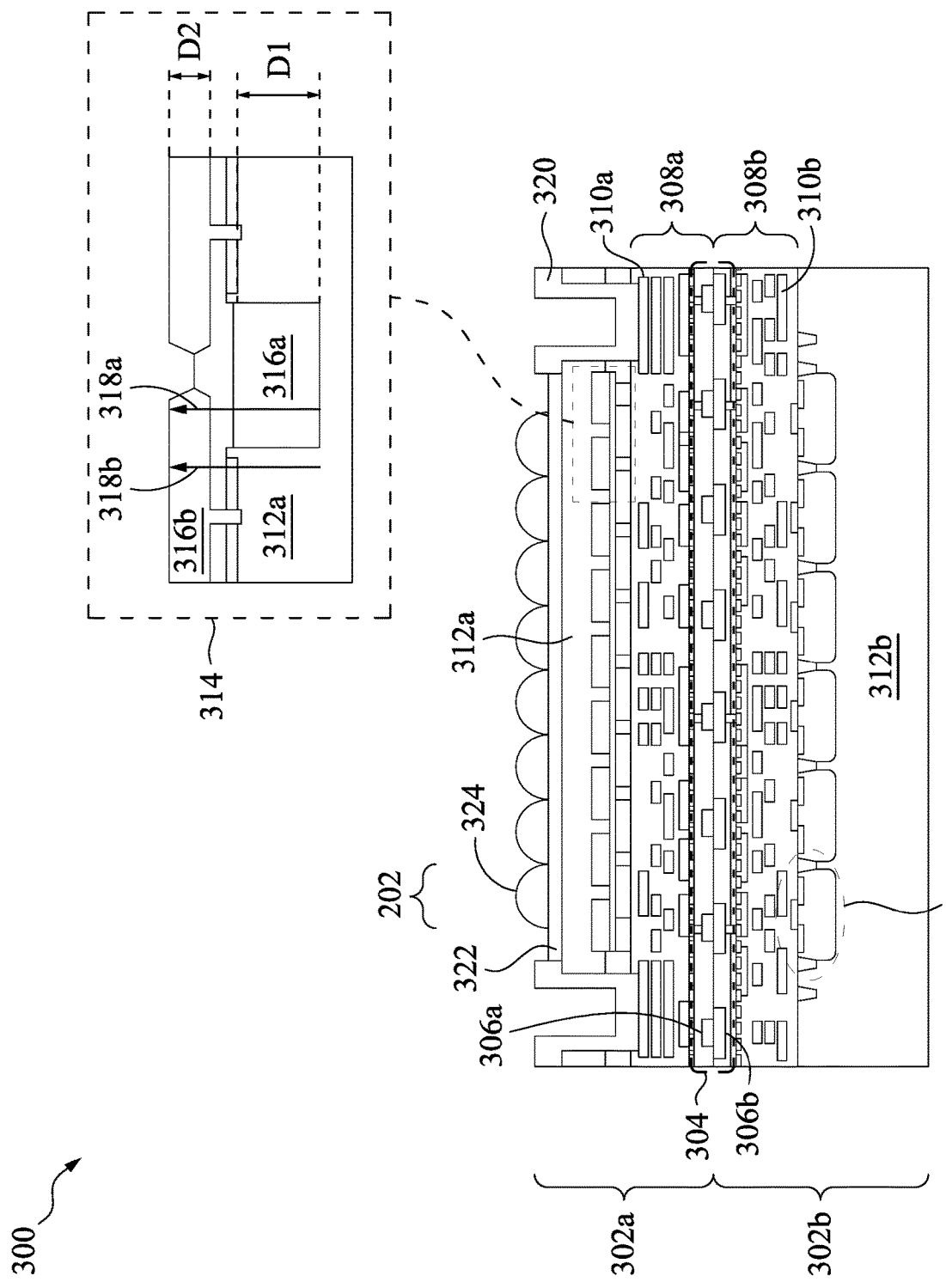
FIG. 3 is diagram of an example semiconductor die package described herein.

FIG. 3 is a diagram of an example optoelectronic device 300 described herein. In some implementations, the optoelectronic device 300 corresponds to a three dimensional complementary metal oxide semiconductor image sensor (3D CIS) device, in which the semiconductor devices 302a and 302b are stacked and/or vertically arranged. As shown in FIG. 3, the semiconductor device 302a (e.g., a photonic semiconductor die) and the semiconductor device 302b (e.g., a complementary metal-oxide semiconductor (CMOS) die) are joined by a bonding interface 304. The bonding interface 304 may include contacts 306a and 306b that are joined through a eutectic bond. The contacts 306a and 306b may include an alloy as an aluminum-copper alloy (Al—Cu), an aluminum-germanium alloy (Al—Ge), or a copper tin alloy (Cu—Sn) material, among other examples.

As further shown in FIG. 3, the semiconductor device 302a may include a dielectric region 308a. The dielectric region 308a (e.g., an intermetal dielectric region) may include one or more layers of dielectric material (e.g., an iron oxide ($Fe_xO_y$), a zinc oxide (ZnO), a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). One or more metallization layers 310a may be formed in and/or in between the layers of the dielectric region 308a. The metallization layers 310a may include bonding pads, conductive lines, and/or other types of conductive structures that electrically connect the various regions of the semiconductor device 302a and/or electrically connect the various regions of the optoelectronic device 300 to one or more external devices and/or external packaging. In some implementations, the metallization layers 310a may be referred to as a BEOL metallization stack, and may include a conductive material, such as gold, copper, silver, cobalt, tungsten, a metal alloy, or a combination thereof, among other examples.

The semiconductor device 302a may further include a substrate 312a. In some implementations, the substrate 312a includes a semiconductor material such as a silicon material (Si) or a gallium arsenide (GaAs) material, among other examples. In some implementations, the substrate 312a includes a dielectric material such as an oxide material, among other examples. Additionally or alternatively, and in some implementations, the substrate 312a conforms to a silicon-on-insulator structure (SOI).

As shown in the detailed view of FIG. 3, the semiconductor device 302a includes a multi-layer photodiode structure 314. The multi-layer photodiode structure 314, which may be included as part of the pixel sensor 202, includes multiple sensing structures, including sensing structure 316a (e.g., a lower sensing structure) and sensing structure 316b (e.g., a sensing structure above the sensing structure 316a). The sensing structures 316a and 316b may each be formed from a layer of a quantum effect material such as a germanium material (Ge), a silicon germanium material (SiGe), a type III material, a type V material, or another suitable quantum effect material. In some implementations, the sensing structures 316a and 316b include a same quantum effect material. In some implementations, the sensing structures 316a and 316b include different, respective quantum effect materials. In some implementations, and as shown in the magnified view of FIG. 3, sidewalls of the sensing structure 316a are in contact with the substrate 312a (e.g., sidewalls of the sensing structure 316a interface with sidewalls of a cavity formed in the substrate 312a).

As described in greater detail in connection with FIGS. 5A-5L, the quantum effect materials of sensing structures 316a and/or 316b may be formed using a selective epitaxial growth process after forming cavities and/or recesses in the substrate 312a (and/or other layers of the multi-layer photodiode structure 314) using photolithography and etching processes. However, other formation techniques may be used, such as formation through direct epitaxial growth processes, formation after surface treatment of the substrate 312a and/or other layers of the multi-layer photodiode structure 314a, among other examples.

In some implementations, each of the sensing structures 316a and 316b includes a plurality of types of ions to form a p-n junction or a p-i-n junction (e.g., a junction between a p-type region, an intrinsic (or undoped) type region, and an n-type region). For example, the sensing structure 316a and/or 316b may be doped with an n-type dopant to form respective n-type regions within the sensing structure 316a and/or 316b. Additionally, or alternatively, the sensing structure 316a and/or 316b may be doped with a p-type dopant to form respective p-type regions within the sensing structure 316a and/or 316b.

As shown in the detailed view of FIG. 3, electromagnetic waves 318a and 318b (e.g., light waves) are shown as passing through the multi-layer photodiode structure 314. The electromagnetic wave 318a is passing through the sensing structure 316a and the sensing structure 316b. Within the multi-layer photodiode structure 314, a quantum length for the electromagnetic wave 318a corresponds to a sum of a thickness D1 of the sensing structure 316a and a thickness D2 of the sensing structure 316b.

Additionally, the electromagnetic wave 318b is passing through the sensing structure 316b. Within the multi-layer photodiode structure 314, a quantum length for the electromagnetic wave 318b corresponds to the thickness D2 of the sensing structure 316b.

As such, an effective quantum length of the multi-layer photodiode structure 314 for the electromagnetic waves 318a and 318b (e.g., D1+D2+D2) is increased relative to another photodiode structure including another sensing structure formed from a single layer of a quantum material (e.g., for the electromagnetic waves 318a and 318b in such a photodiode structure, an effective quantum length would be D1+D1 or D2+D2).

In this way, a performance (e.g., a sensitivity) of the optoelectronic device 300 including the multi-layer photodiode structure 314 is increased relative to another optoelectronic device including a photodiode structure including a sensing structure formed from a single layer of a quantum effect material. By improving the performance of the optoelectronic device 300, a quality and a reliability of the optoelectronic device 300 for a target application and/or environment may increase to improve a manufacturing yield and reduce a rate of field failures. Improving the manufacturing yield and reducing the rate of field failures may reduce an amount of resources (e.g., raw materials, semiconductor manufacturing tools, labor, and/or computing resources) needed to support a market consuming the optoelectronic device 300.

A range of thicknesses of the sensing structure 316a and the sensing structure 316b may be similar. For example, and in some implementations, the thickness D1 and the thickness D2 are each included in a range of approximately 1 micron to approximately 10 microns.

In some implementations, the thickness D2 is lesser relative to the thickness D1. Additionally, or alternatively, a ratio of D2:D1 may be included in a range of approximately 1:2 to approximately 1:1. If the ratio D2:D1 is included in the range of approximately 1:2 to approximately 1:1, an effective quantum length of multi-layer photodiode structure 314 may be sufficiently extended to satisfy a quantum effect performance threshold (e.g., a sensitivity threshold for the optoelectronic device 300). Additionally, or alternatively and if the ratio D2:D1 is within the range of approximately 1:2 to approximately 1:1, a size of the multi-layer photodiode structure 314 may be such that the multi-layer photodiode structure 314 is spatially compatible with other integrated circuitry included in the optoelectronic device 300. Additionally, or alternatively and if the ratio D2:D1 is within the range of approximately 1:2 to approximately 1:1, a cost of the optoelectronic device 300 may be viable. If D2:D1 is less than approximately 1:2, the effective quantum length of the multi-layer photodiode structure 314 may not be sufficiently extended to satisfy the quantum effect performance threshold. If the ratio D2:D1 is greater than approximately 1:1, a cost and/or efficiency of manufacturing the optoelectronic device 300 may increase. Additionally, or alternatively, and if the ratio D2:D1 is greater than approximately 1:1, a size of the multi-layer photodiode structure 314 may be such that the multi-layer photodiode structure 314 is spatially incompatible with other integrated circuitry included in the optoelectronic device 300. However, other values and ranges for the thicknesses D1 and D2, and the ratio D2:D1, are within the scope of the present disclosure.

The semiconductor device 302a may include additional features such as fixed lenses or modulated lenses that focus and/or distribute electromagnetic waves (e.g., the electromagnetic waves 318a, 318b, and/or other similar electromagnetic waves) amongst the sensing structures (e.g., the sensing structures 316a and/or 316b, and/or other similar sensing structures) to tune or enhance a performance of the multi-layer photodiode structure 314. Focusing and/or distributing the electromagnetic waves may include focusing and/or distributing the electromagnetic waves to pass through centers of sensing structures or edges of sensing structures, among other examples.

As shown in FIG. 3, the semiconductor device 302a includes a bonding pad 320. The bonding pad 320 may contact one or more metallization layers 310a in the dielectric region 308a. The bonding pad 320 may include a conductive material, such as gold, silver, aluminum, copper, aluminum-copper, titanium, tantalum, titanium nitride, tantalum nitride, tungsten, a metal alloy, other metals, or a combination thereof. The bonding pad 320 may provide electrical connections between the metallization layers 310a of the optoelectronic device 300 and external devices and/or external packaging.

In some implementations, and shown in FIG. 3, the semiconductor device 302a includes a dielectric layer 322 above the multi-layer photodiode structure 314. In some implementations, the dielectric layer 322 includes a material such as a titanium nitride (TiN) material or an oxide such as a silicon dioxide ($SiO_2$) material. In some implementations, portions of the dielectric layer 322 are included as part of a color filter array (CFA) structure. Additionally, or alternatively, and in some implementations, portions of the dielectric layer 322 are included as part of a hard mask (HM) structure.

As further shown in FIG. 3, a micro-lens layer 324 is included above and/or on the dielectric layer 322. The micro-lens layer 324 may include a plurality of micro-lenses. In particular, the micro-lens layer 324 may include a respective micro-lens for pixel sensors in a pixel sensor array (e.g., each of the pixel sensors 202 included in the pixel array 200).

As further shown in FIG. 3, the semiconductor device 302b may include a dielectric region 308b. The dielectric region 308b (e.g., an intermetal dielectric region) may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). One or more metallization layers 310b may be formed in and/or in between the layers of the dielectric region 308b. The metallization layers 310b may include bonding pads, conductive lines, and/or other types of conductive structures that electrically connect the various regions of the semiconductor device 302b and/or electrically connect the various regions of the optoelectronic device 300 to one or more external devices and/or external packaging. In some implementations, the metallization layers 310b may be referred to as a BEOL metallization stack, and may include a conductive material, such as gold, copper, silver, cobalt, tungsten, a metal alloy, or a combination thereof, among other examples.

The semiconductor device 302b may further include a substrate 312b. In some implementations, the substrate 312b includes a semiconductor material such as a silicon material (Si) or a gallium arsenide material (GaAs), among other examples. As further shown in FIG. 3, the semiconductor device 302b includes logic integrated circuitry 326 in or on the substrate 312b. In some implementations, the logic integrated circuitry 326 is electrically connected to the multi-layer photodiode structure 314 through the bonding interface 304 (e.g., through the contacts 306a and 306b).

As shown in FIG. 3, a device (e.g., the optoelectronic device 300) includes a first semiconductor die (e.g., the semiconductor device 302a). The first semiconductor die includes a first substrate (e.g., the substrate 312a) and a pixel sensor (e.g., the pixel sensor 202). The pixel sensor includes a multi-layer photodiode structure (e.g., the multi-layer photodiode structure 314) that includes a first sensing structure that extends into the first substrate, a first quantum effect material, and has sidewalls that are in direct contact with the first substrate. The multi-layer photodiode structure includes a second sensing structure that is above the first sensing structure and includes a second quantum effect material. The device includes a second semiconductor die (e.g., the semiconductor device 302b) joined with the first semiconductor die below the first semiconductor die. The second semiconductor die includes a second substrate (e.g., the substrate 312b) and logic integrated circuitry (e.g., the logic integrated circuitry 326) on or within the second substrate.

Although the optoelectronic device 300 of FIG. 3 corresponds to a stacked device (e.g., the semiconductor device 302a stacked on the semiconductor device 302b), structures and/or features described in connection with FIG. 3 may be included in other types of optoelectronic devices (frontside illumination sensor (FSI) devices or backside illumination sensor (BSI) devices, among other examples).

As indicated above, FIG. 3 is provided as an example. Other examples may differ from what is described with regard to FIG. 3.

FIG. 4A-4D are diagrams of example implementations 400 of a multi-layer photodiode structure described herein. The multi-layer photodiode structure may correspond to the multi-layer photodiode structure 314 described in connection with FIG. 3 and elsewhere herein. FIGS. 4A-4D show different configurations of the multi-layer photodiode structure 314 in relation to an electromagnetic wave transmissive region 402 (e.g., an electromagnetic transmissive region for the electromagnetic waves 318a and 318b) that includes the sensing structure 316a and has a same approximate width as the sensing structure 316a.

In the multi-layer photodiode structure 314a of FIG. 4A, the electromagnetic wave transmissive region 402 includes the sensing structure 316a and a portion of the sensing structure 316b (e.g., the sensing structure 316b extends laterally into the electromagnetic wave transmissive region 402).

In FIG. 4A, the sensing structure 316a extends into the substrate 312a. Sidewalls of the multi-layer photodiode structure 314a are in contact (e.g., direct contact) with substrate 312a. As described in greater detail in connection with FIGS. 5B and 5C, the sidewalls of the sensing structure 316a (e.g., a first sensing structure) may be in contact with sidewalls of a cavity formed in the substrate 312a. Furthermore, the sensing structure 316b (e.g., a second sensing structure) is over the sensing structure 316a (e.g., the first sensing structure).

As further shown in FIG. 4A, the electromagnetic wave transmissive region 402 and the sensing structure 316a have the same approximate width D3. As an example, the width D3 may be included in a range of approximately 1 micron to approximately 10 microns. If the width D3 is within the range of approximately 1 micron to approximately 10 microns, the electromagnetic wave transmissive region 402 may provide a sufficient width to detect electromagnetic waves (e.g., the electromagnetic waves 318a and 318b) to improve a performance of the multi-layer photodiode structure 314a. Additionally, or alternatively and if the width D3 is within the range of approximately 1 micron to approximately 10 microns, a size of the multi-layer photodiode structure 314 may maintain a size (and cost) of an optoelectronic device including multi-layer photodiode structure 314 (e.g., the optoelectronic device 300 within a viable range). If the width D3 is less than approximately 1 micron, the sensing structure 316a and/or the electromagnetic wave transmissive region 402 may span an area that is insufficient to detect electromagnetic waves (e.g., the electromagnetic waves 318a and 318b) and as a result decrease a performance of the multi-layer photodiode structure 314a. If the width D3 is greater than approximately 10 microns, a size (and a cost) of an optoelectronic device including the multi-layer photodiode structure 314a (e.g., the optoelectronic device 300) may increase. However, other values and ranges for the width D3 are included within the scope of the present disclosure.

The multi-layer photodiode structure 314a includes a layer of an oxide material 404 that is below the sensing structure 316b and above the sensing structure 316a. The layer of the oxide material 404 may include a silicon dioxide material (SiO2), among other examples.

Further, the multi-layer photodiode structure 314a includes a layer of a dielectric material 406a (e.g., a first layer of a dielectric material) over the layer of the oxide material 404. The layer of the dielectric material 406a may include a silicon nitride material (SiN), among other examples.

As further shown in FIG. 4A, the sensing structure 316b includes a bottom-side protrusion 408a (e.g., a first bottom-side protrusion) that extends through the layer of the dielectric material 406a, through the layer of the oxide material 404, and to the substrate. As described in greater detail in connection with FIGS. 5F and 5G, the bottom-side protrusion 408a may be formed during an epitaxial growth operation that initiates formation of the sensing structure 316b within a cavity that passes through the layer of the dielectric material 406a and through the layer of the oxide material 404.

Figure 4B:
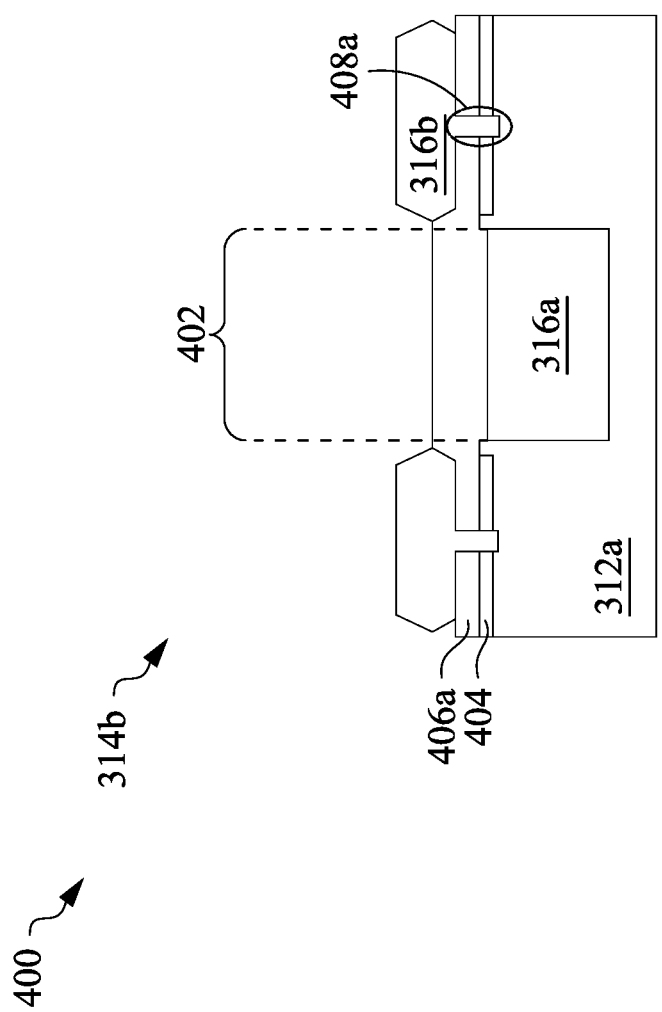

As shown in the multi-layer photodiode structure 314b of FIG. 4B (a second example implementation), and in contrast to the multi-layer photodiode structure 314a of FIG. 4A, the sensing structure 316b is contained outside the electromagnetic wave transmissive region 402. The multi-layer photodiode structure 314b may satisfy a performance range (e.g., a range bounded by lower and upper sensitivity thresholds) that is different than another performance range associated with the multi-layer photodiode structure 314a. Additionally, or alternatively, an effective quantum length of the multi-layer photodiode structure 314b may be different than an effective quantum length associated with multi-layer photodiode structure 314a.

As shown in the multi-layer photodiode structure 314c of FIG. 4C (a third example implementation), and in contrast to the multi-layer photodiode structure 314a of FIG. 4A and the multi-layer photodiode structure 314b of FIG. 4B, the electromagnetic wave transmissive region 402 includes a portion of the sensing structure 316c (e.g., a third sensing structure that extends laterally into the electromagnetic wave transmissive region 402).

The multi-layer photodiode structure 314c of FIG. 4C further includes a layer of a dielectric material 406b (e.g., a second layer of dielectric material) above the sensing structure 316b. The sensing structure 316c is above the layer of the dielectric material 406b, and a layer of an epitaxy material 410 (a layer of a silicon material (Si), among other examples) that is between the sensing structure 316c and the sensing structure 316b.

The sensing structure 316c includes a bottom-side protrusion 408b (a second bottom-side protrusion) that extends downwards through the layer of the dielectric material 406b and to the layer of the epitaxy material 410. In some implementations, a quantum effect material of the sensing structure 316c and a quantum effect material of the sensing structure 316a and/or the sensing structure 316b is a same quantum effect material. In some implementations, a quantum effect material of the sensing structure 316c and a quantum effect material of the sensing structure 316a and/or the sensing structure 316b is a different quantum effect material.

The multi-layer photodiode structure 314c may satisfy a performance range that is different than another performance range associated with the multi-layer photodiode structure 314a and/or the multi-layer photodiode structure 314b. Additionally, or alternatively, an effective quantum length of the multi-layer photodiode structure 314c may be different than an effective quantum length associated with the multi-layer photodiode structure 314a and/or the multi-layer photodiode structure 314b.

Figure 4D:
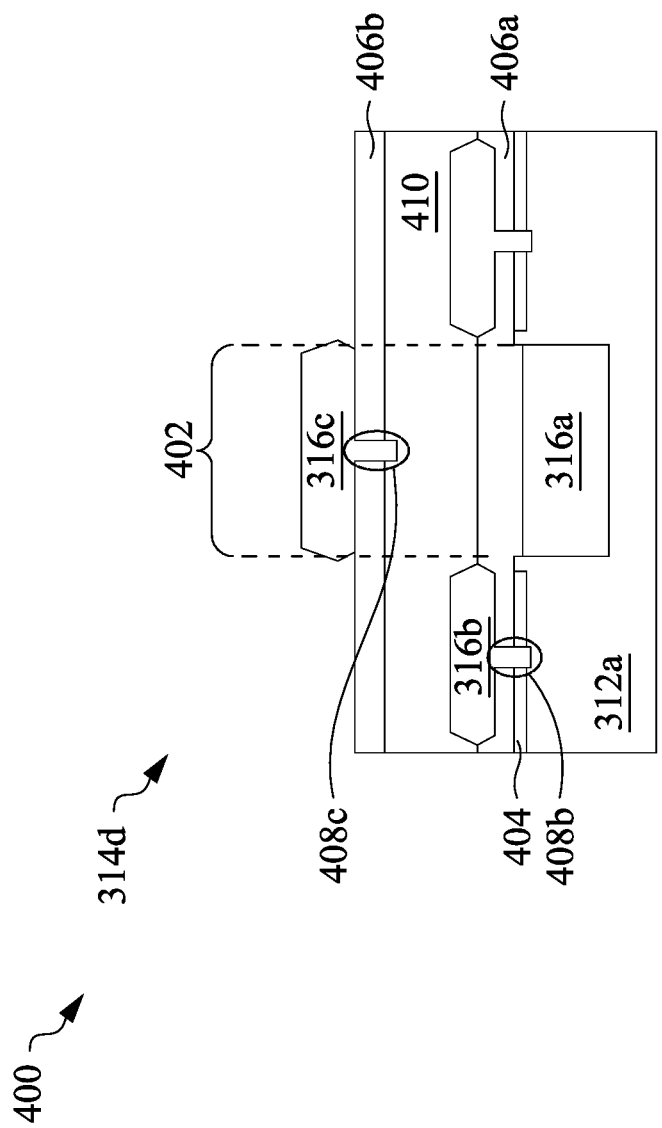

As shown in the multi-layer photodiode structure 314d of FIG. 4D (a fourth example implementation), and in contrast to the multi-layer photodiode structure 314b of FIG. 4C, the sensing structure 316c is within the electromagnetic wave transmissive region 402. The multi-layer photodiode structure 314d may satisfy a performance range that is different than another performance range associated with the multi-layer photodiode structure 314a, the multi-layer photodiode structure 314b, and/or the multi-layer photodiode structure 314c. Additionally, or alternatively, an effective quantum length of the multi-layer photodiode structure 314c may be different than an effective quantum length associated with the multi-layer photodiode structure 314a, the multi-layer photodiode structure 314b, and/or the multi-layer photodiode structure 314c.

As described in connection with FIGS. 3 and 4A-4D, and in some implementations, an optoelectronic device (e.g., the optoelectronic device 300) includes a substrate (e.g., the substrate 312a). The optoelectronic device includes a multi-layer photodiode structure (e.g., the multi-layer photodiode structure 314) including a first sensing structure (e.g., the sensing structure 316a) that extends into the substrate. The first sensing structure includes a first quantum effect material and has sidewalls that are in direct contact with the substrate. The multi-layer photodiode structure includes a second sensing structure (e.g., the sensing structure 316b) that is above the first sensing structure and includes a second quantum effect material. The multi-layer photodiode structure includes a layer of an oxide material (e.g., the layer of the oxide material 404) that is below the second sensing structure and that is above the first sensing structure. The multi-layer photodiode structure includes layer of a dielectric material (e.g., the layer of the dielectric material 406a) that is above the layer of the oxide material and that is below the second sensing structure.

As indicated above, FIGS. 4A-4D are provided as examples. Other examples may differ from what is described with regard to FIGS. 4A-4D.

FIGS. 5A-5L are diagrams of an example implementation 500 described herein. The implementation 500 may include a series of one or more semiconductor processing operations performed by the one or more semiconductor processing tools 102-116 and/or the wafer/die transport tool 118 of FIG. 1.

As shown in FIG. 5A, the layer of the oxide material 404 is formed over and/or on the substrate 312a. The deposition tool 102 may be used to deposit the layer of the oxide material 404 (or another suitable dielectric material) in a PVD operation, an ALD operation, a CVD operation, an epitaxy operation, an oxidation operation, another type of deposition operation described in connection with FIG. 1, and/or another suitable deposition operation. In some implementations, the planarization tool 110 may be used to planarize the layer of the oxide material 404 after the layer of the oxide material is deposited.

As an example, and in some implementations, the layer of the oxide material 404 has a thickness of up to approximately 1 micron. However, other values and ranges for the thickness are within the scope of the present disclosure.

Figure 5B:
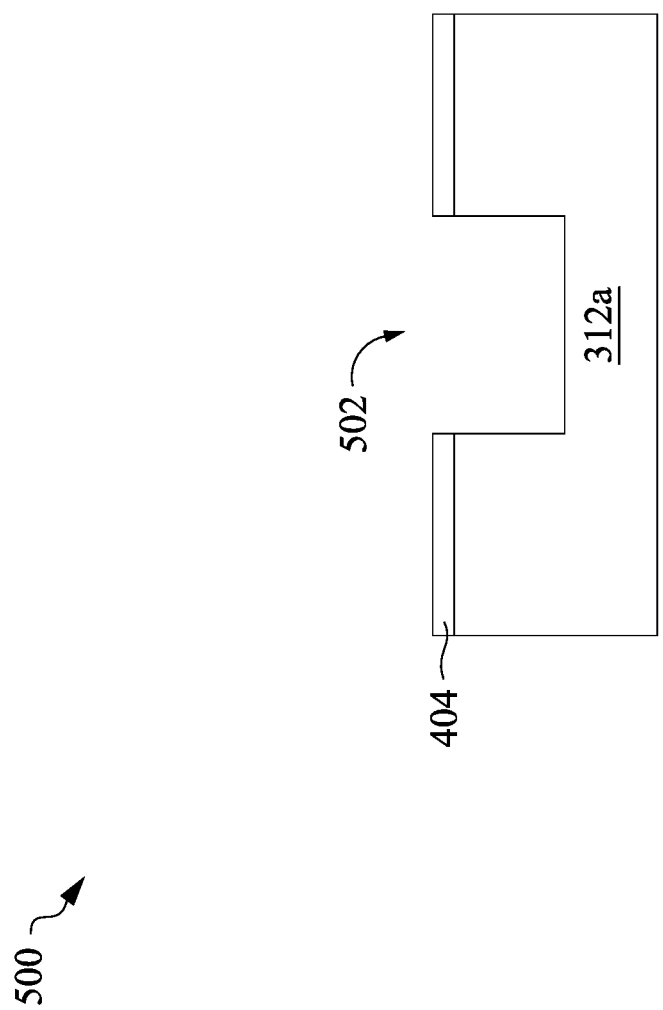

As shown in FIG. 5B, a cavity 502 is formed through the layer of the oxide material 404 and into the substrate 312a. In some implementations, a pattern in a photoresist layer is used to etch the layer of the oxide material 404 and the substrate 312a to form the cavity 502. In these implementations, the deposition tool 102 may be used to form the photoresist layer on the layer of the oxide material 404. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the oxide material 404 and the substrate 312a based on the pattern to form the cavity 502. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the oxide material 404 and the substrate 312a based on a pattern.

As an example, and in some implementations, the cavity 502 has a width of up to approximately 10 microns and a depth of up to approximately 10 microns. However, other values and ranges for the width and the depth are within the scope of the present disclosure.

Figure 5C:
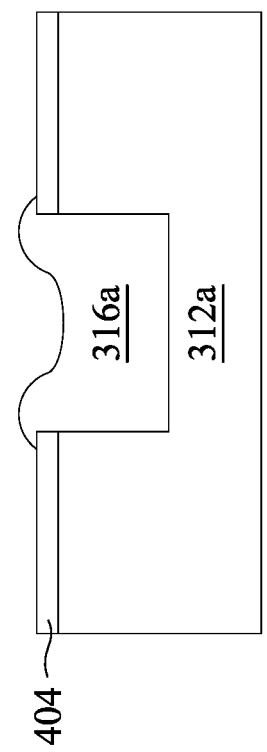

As shown in FIG. 5C, the sensing structure 316a is formed over and/or on the substrate 312a (e.g., within the cavity 502). The deposition tool 102 may be used to deposit a quantum effect material to form the sensing structure 316a in an epitaxy operation, another type of deposition operation described in connection with FIG. 1, and/or another suitable deposition operation.

Figure 5D:
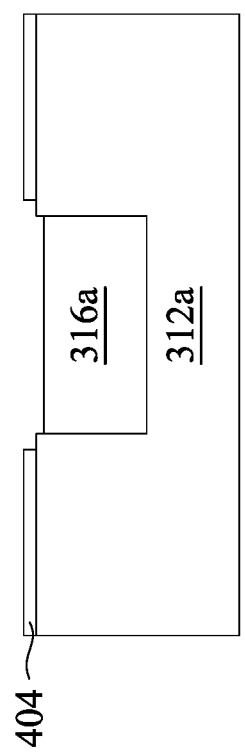

As shown in FIG. 5D, the sensing structure 316a is planarized. The planarization tool 110 may be used to planarize the sensing structure 316a using a CMP operation, another type of planarization operation described in connection with FIG. 1, and/or another planarization operation. In some implementations, planarization of the sensing structure 316a may include removing a portion of the layer of the oxide material 404.

Figure 5E:
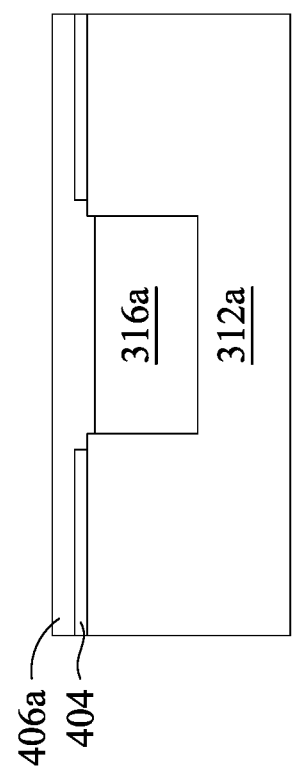

As shown in FIG. 5E, the layer of the dielectric material 406a is formed over and/or on the layer of the oxide material 404 and over and/or on the sensing structure 316a. The deposition tool 102 may be used to deposit the layer of the dielectric material 406a in a PVD operation, an ALD operation, a CVD operation, an epitaxy operation, an oxidation operation, another type of deposition operation described in connection with FIG. 1, and/or another suitable deposition operation. In some implementations, the planarization tool 110 may be used to planarize the layer of the dielectric material 406a after the layer of the dielectric material 406a is deposited.

As an example, and in some implementations, the layer of the dielectric material 406a has a thickness of up to approximately 2 microns. However, other values and ranges for the thickness are within the scope of the present disclosure.

Figure 5F:
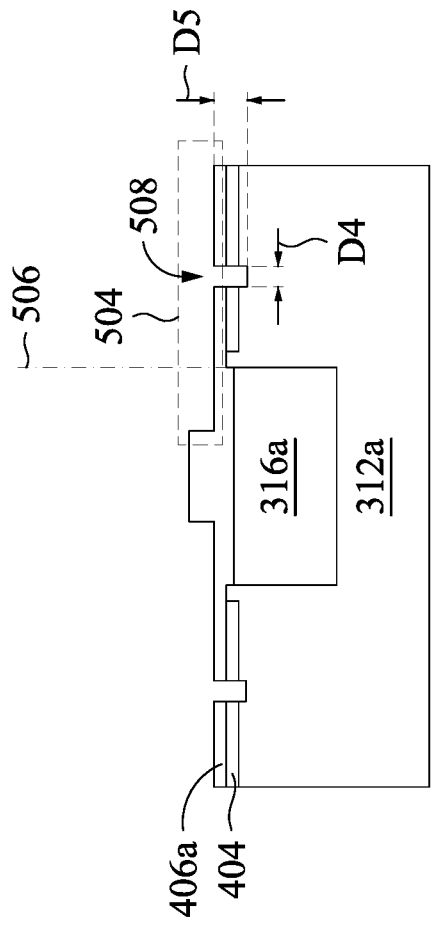

As shown in FIG. 5F, a recessed region 504 is formed in the layer of the dielectric material 406a. In some implementations, a pattern in a photoresist layer is used to etch the layer of the dielectric material 406a to form the recessed region 504. In these implementations, the deposition tool 102 may be used to form the photoresist layer on the layer of the dielectric material 406a. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406a based on the pattern to form the recess in the layer of the dielectric material 406a. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the dielectric material 406a based on a pattern.

In some implementations (the multi-layer photodiode structure 314a of FIG. 4A, among other examples) and as shown in FIG. 5F, the recessed region 504 extends across a boundary 506 corresponding to an outer edge of the sensing structure 316a such that the recessed region 504 overlaps the sensing structure 316a. In some implementations (the multi-layer photodiode structure 314b of FIG. 4B, among other examples), the recessed region 504 is contained adjacent to the boundary 506 such that no portion of the recessed region 504 overlaps the sensing structure 316a.

As further shown in FIG. 5F, a cavity 508 is formed in the recessed region 504, through the layer of the dielectric material 406a, and through the layer of the oxide material 404 to the substrate 312a. In some implementations, a pattern in a photoresist layer is used to etch the layer of the dielectric material 406a and the layer of the oxide material 404 to form the cavity 508. In these implementations, the deposition tool 102 may be used to form the photoresist layer on the layer of the dielectric material 406a. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406a and the layer of the oxide material 404 based on the pattern to form the cavity 508. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the oxide the dielectric material 406a and the layer of the oxide material 404 based on a pattern.

In some implementations, the cavity 508 may be formed to have a width D4 that is included in a range of approximately 0.1 microns to approximately 1.0 micron. Additionally, or alternatively, the cavity 508 may be formed to have a depth D5 that is included in a range of approximately 0.1 microns to approximately 1.0 micron. If the width D4 and/or the depth D5 are within the range of approximately 0.1 microns to approximately 1.0 micron, a volume of the cavity 508 may be sufficient to initiate epitaxial growth of a quantum effect material for another sensing structure (e.g., the sensing structure 316b). Additionally, or alternatively, an aspect ratio of the cavity 508 may reduce defects (e.g., peeling, voids) within the quantum effect material. If the cavity 508 has a width D4 and/or a depth D5 of less than approximately 0.1 microns, a volume of the cavity 508 may be insufficient to initiate epitaxial growth of a quantum effect material for the other sensing structure. If the cavity 508 has a width D4 and/or a depth D5 of greater than approximately 1.0 micron, the aspect ratio of the cavity 508 may cause defects (e.g., peeling, voids) within the quantum effect material. However, other values and ranges for the width D4 and the depth D5 are within the scope of the present disclosure.

Figure 5G:
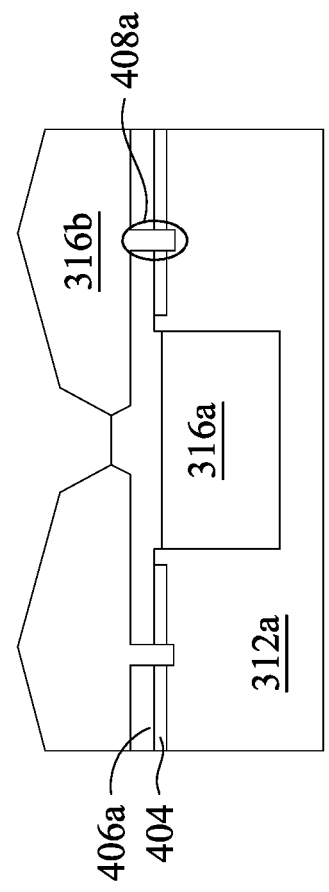

As shown in FIG. 5G, the sensing structure 316b is formed over and/or on the layer of the dielectric material 406a (e.g., within the recessed region 504). The deposition tool 102 may be used to deposit a quantum effect material to form the sensing structure 316b in an epitaxy operation, another type of deposition operation described in connection with FIG. 1, and/or another suitable deposition operation. As shown in FIG. 5G, forming the sensing structure 316b includes forming the bottom-side protrusion 408a (e.g., within the cavity 508). The bottom-side protrusion 408a may have similar dimensions to the cavity 508 (e.g., a width D4 and a depth D5).

Figure 5H:
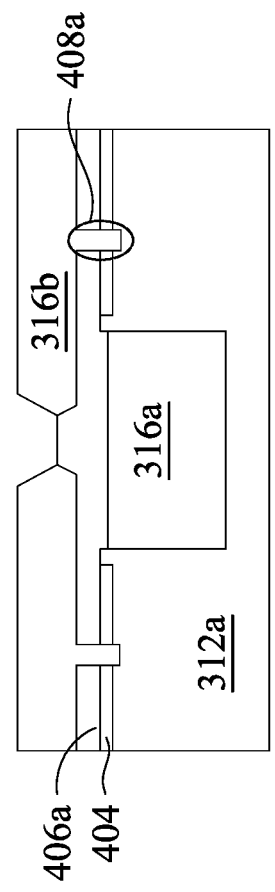

A shown in FIG. 5H, the sensing structure 316b is planarized. The planarization tool 110 may be used to planarize the sensing structure 316b using a CMP operation, another type of planarization operation described in connection with FIG. 1, and/or another planarization operation.

Figure 5I:
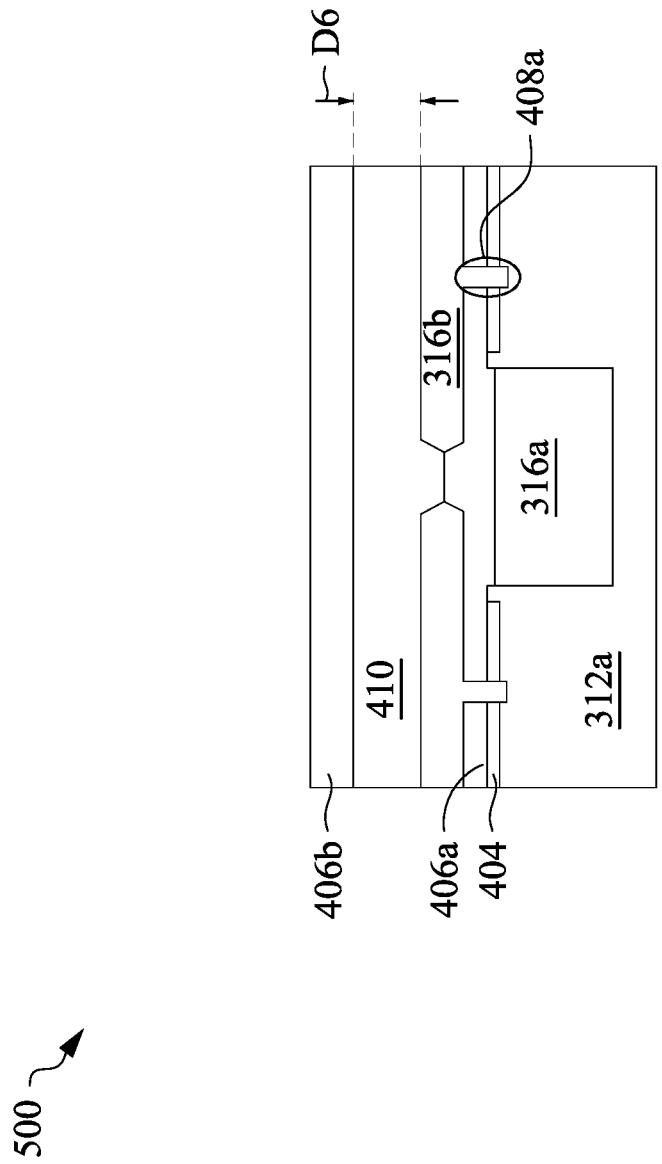

As shown in FIG. 5I, the layer of epitaxial material 410 is formed on and/or over the sensing structure 316b. The deposition tool 102 may be used to deposit the layer of the epitaxial material 410 in an epitaxy operation, another type of deposition operation described in connection with FIG. 1, and/or another suitable deposition operation. In some implementations, the planarization tool 110 may be used to planarize the layer of the epitaxial material 410 after the layer of the epitaxial material 410 is deposited.

As an example, and in some implementations, the layer of the epitaxial material 410 has a thickness D6 that is included in a range of approximately 4 microns to approximately 6 microns. If the thickness D6 is included in the range of approximately 4 microns to approximately 6 microns, a risk of an electrical leakage within a semiconductor device including the layer of epitaxial material 410 (e.g., the semiconductor device 302a) may be reduced. Additionally, or alternatively and if the thickness D6 is included in the range of approximately 4 microns to approximately 6 microns, a cost of manufacturing the semiconductor device may be viable. If the thickness D6 is less than approximately 4 microns, the risk of leakage within a semiconductor device including the layer of epitaxial material 410 may increase. If the thickness D6 is greater than approximately 6 microns, a cost of manufacturing the semiconductor device may increase and not be viable. However, other values and ranges for the thickness D6 are within the scope of the present disclosure.

As further shown in FIG. 5I, the layer of the dielectric material 406b is formed over and/or on the layer of the epitaxial material 410. The deposition tool 102 may be used to deposit the layer of the dielectric material 406b in a PVD operation, an ALD operation, a CVD operation, an epitaxy operation, an oxidation operation, another type of deposition operation described in connection with FIG. 1, and/or another suitable deposition operation. In some implementations, the planarization tool 110 may be used to planarize the layer of the dielectric material 406b after the layer of the dielectric material 406b is deposited.

As an example, and in some implementations, the layer of the dielectric material 406b has a thickness of up to approximately 2 microns. However, other values and ranges for the thickness are within the scope of the present disclosure.

Figure 5J:
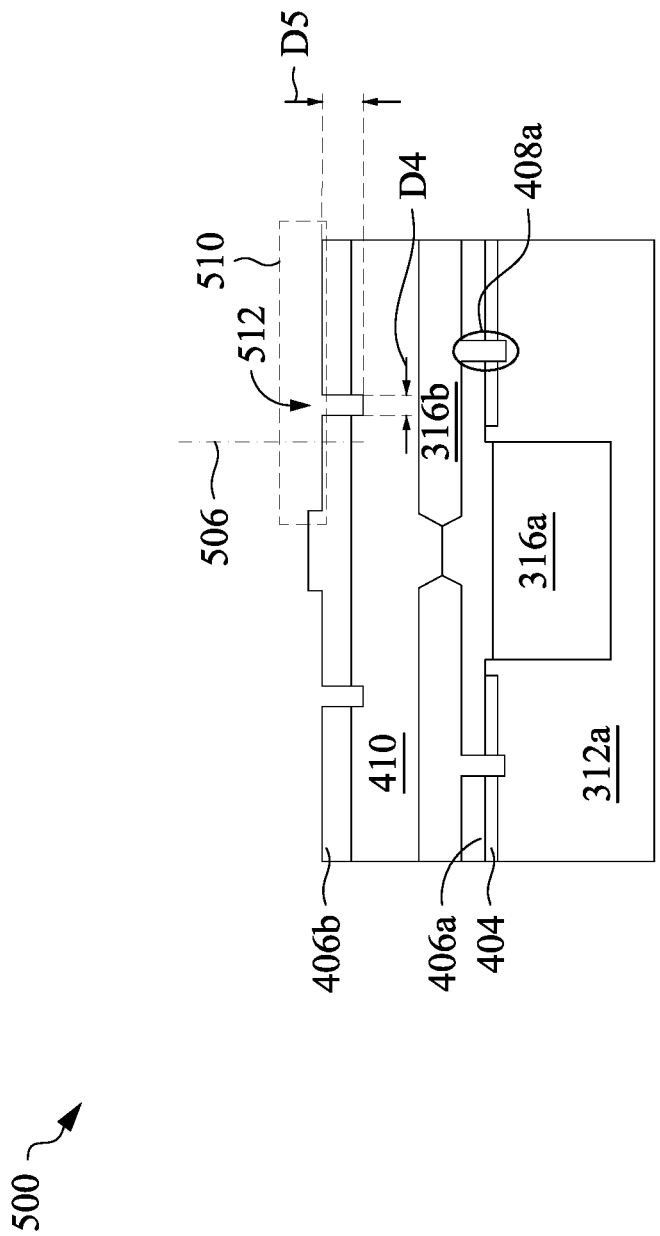

As shown in FIG. 5J, a recessed region 510 is formed in the layer of the dielectric material 406b. In some implementations, a pattern in a photoresist layer is used to etch the layer of the dielectric material 406b to form the recessed region 510. In these implementations, the deposition tool 102 may be used to form the photoresist layer on the layer of the dielectric material 406b. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406b based on the pattern to form the recess in the layer of the dielectric material 406b. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the dielectric material 406b based on a pattern.

In some implementations (the multi-layer photodiode structure 314c of FIG. 4C, among other examples) and as shown in FIG. 5J, the recessed region 510 extends across the boundary 506 corresponding to the outer edge of the sensing structure 316a such that the recessed region 510 overlaps the sensing structure 316a. In some implementations (the multi-layer photodiode structure 314d of FIG. 4D, among other examples), the recessed region 510 is centered above the sensing structure 316a.

As further shown in FIG. 5J, a cavity 512 is formed in the recessed region 510, through the layer of the dielectric material 406b, and to the layer of the epitaxial material 410. In some implementations, a pattern in a photoresist layer is used to etch the layer of the dielectric material 406b to form the cavity 512. In these implementations, the deposition tool 102 may be used to form the photoresist layer on the layer of the dielectric material 406b. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the layer of the dielectric material 406b based on the pattern to form the cavity 512. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the layer of the oxide the dielectric material 406b.

In some implementations, the cavity 512 may have similar dimensions to those of other cavities used to form a sensing structure (e.g., the cavity 508 used to epitaxially grow the sensing structure 316b). For example, the cavity 512 may be formed to have a width D4 that is included in a range of approximately 0.1 microns to approximately 1.0 micron. Additionally, or alternatively, the cavity 512 may be formed to have a depth D5 that is included in a range of approximately 0.1 microns to approximately 1.0 micron. If the width D4 and/or the depth D5 are within the range of approximately 0.1 microns to approximately 1.0 micron, a volume of the cavity 512 may be sufficient to initiate epitaxial growth of a quantum effect material for another sensing structure (e.g., the sensing structure 316*c*). Additionally, or alternatively, an aspect ratio of the cavity 512 may reduce defects (e.g., peeling, voids) within the quantum effect material. If the cavity 512 has a width D4 and/or a depth D5 of less than approximately 0.1 microns, a volume of the cavity 512 may be insufficient to initiate epitaxial growth of a quantum effect material for the other sensing structure. If the cavity 512 has a width D4 and/or a depth D5 of greater than approximately 1.0 micron, the aspect ratio of the cavity 512 may cause defects (e.g., peeling, voids) within the quantum effect material. However, other values and ranges for the width D4 and the depth D5 are within the scope of the present disclosure.

Figure 5K:
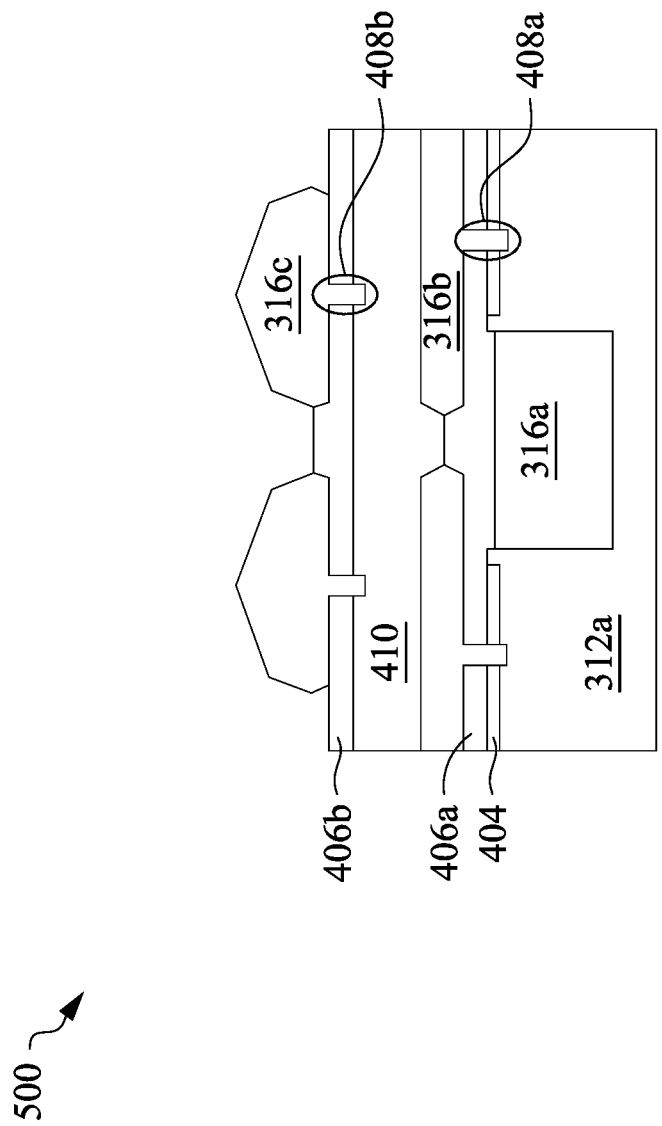

As shown in FIG. 5K, the sensing structure 316*c* is formed over and/or on the layer of the epitaxial material 410 (e.g., within the recessed region 510). The deposition tool 102 may be used to deposit a quantum effect material to form the sensing structure 316*c* in an epitaxy operation, another type of deposition operation described in connection with FIG. 1, and/or another suitable deposition operation. As shown in FIG. 5K forming the sensing structure 316*c* includes forming the bottom-side protrusion 408*b* (e.g., within the cavity 512). The bottom-side protrusion 408*b* may have similar dimensions to the cavity 512 (e.g., a width D4 and a depth D5).

Figure 5L:
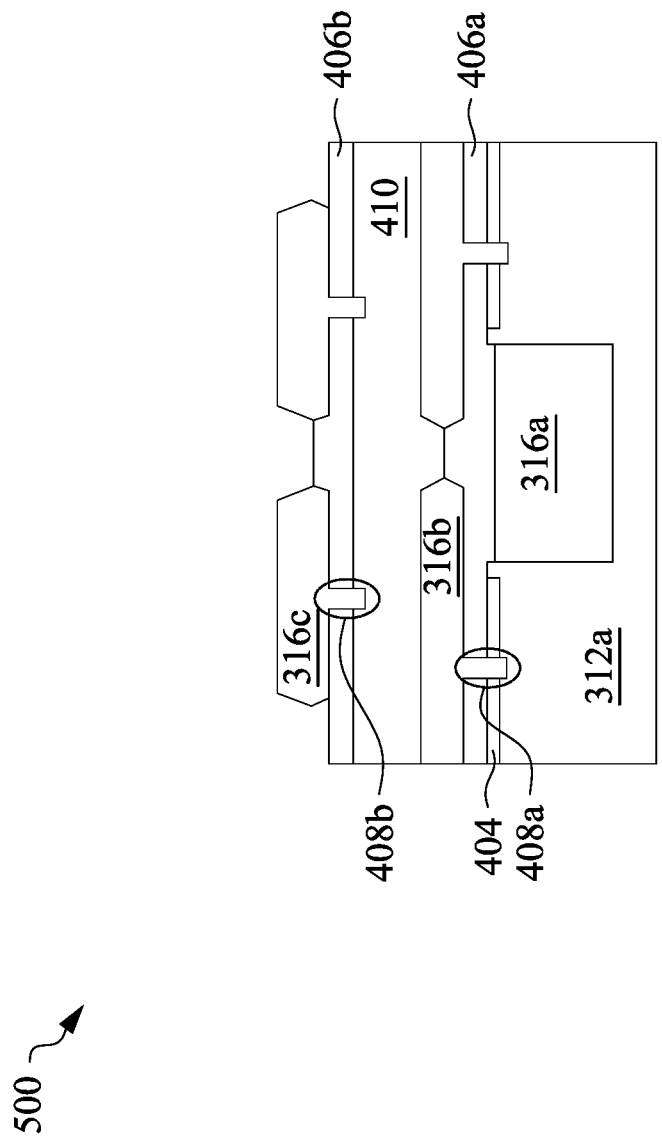

A shown in FIG. 5L, the sensing structure 316*c* is planarized. The planarization tool 110 may be used to planarize the sensing structure 316*c* using a CMP operation, another type of planarization operation described in connection with FIG. 1, and/or another planarization operation.

The implementation 500 shown in FIGS. 5A-5L is provided as an example. The implementation 500 may include additional semiconductor processing operations, fewer semiconductor processing operations, different semiconductor processing operations, or differently arranged semiconductor processing operations than those shown in FIGS. 5A-5L. Additionally, or alternatively, one or more of the semiconductor processing operations may be performed using techniques and/or semiconductor processing tools other than those described in connection with FIG. 1.

Figure 6:
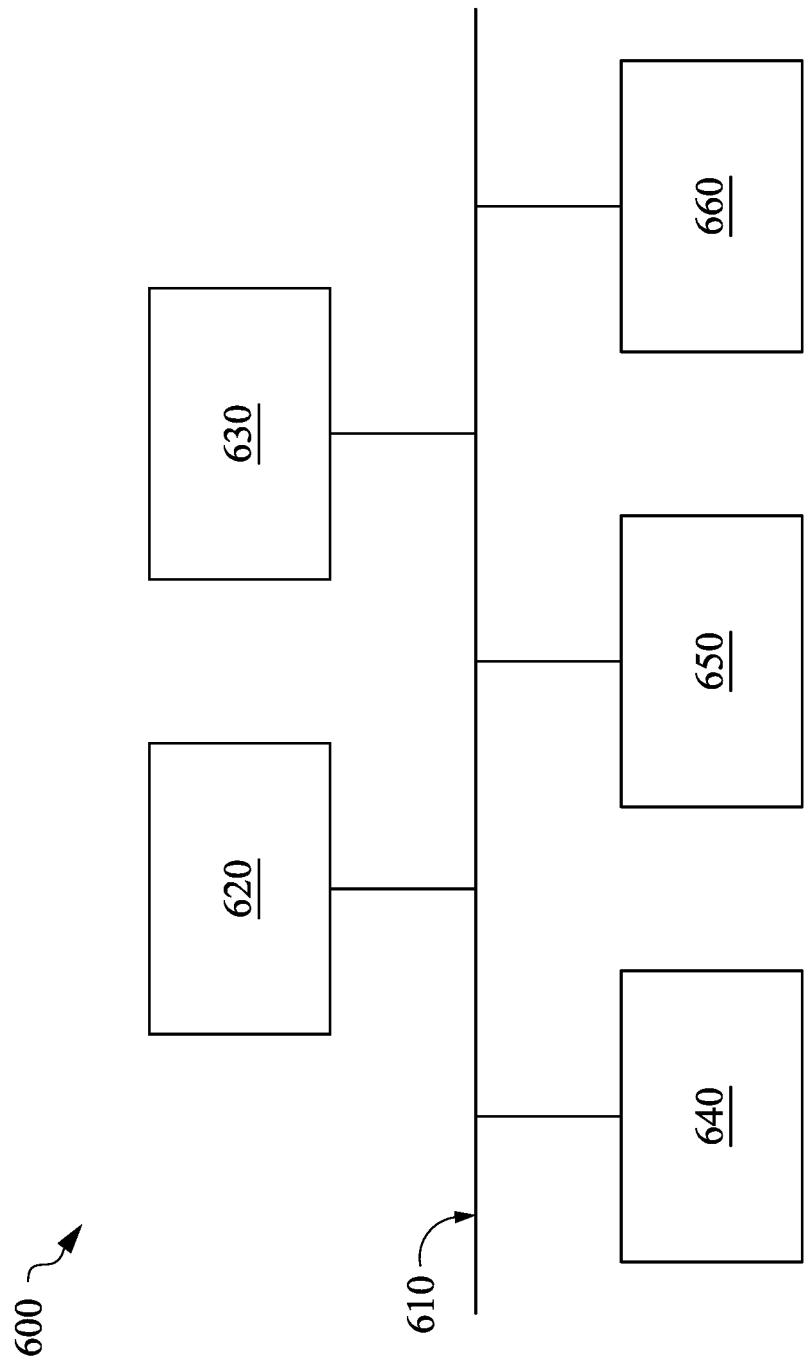
FIG. 6 is a diagram of example components of one or more devices of FIG. 1 described herein.

FIG. 6 is a diagram of example components of one or more devices of FIG. 1 described herein. In some implementations, the semiconductor processing tools 102-116 and/or the wafer/die transport tool 118 may include one or more devices 600 and/or one or more components of the device 600. As shown in FIG. 6, the device 600 may include a bus 610, a processor 620, a memory 630, an input component 640, an output component 650, and/or a communication component 660.

The bus 610 may include one or more components that enable wired and/or wireless communication among the components of the device 600. The bus 610 may couple together two or more components of FIG. 6, such as via operative coupling, communicative coupling, electronic coupling, and/or electric coupling. For example, the bus 610 may include an electrical connection (e.g., a wire, a trace, and/or a lead) and/or a wireless bus. The processor 620 may include a central processing unit, a graphics processing unit, a microprocessor, a controller, a microcontroller, a digital signal processor, a field-programmable gate array, an application-specific integrated circuit, and/or another type of processing component. The processor 620 may be implemented in hardware, firmware, or a combination of hardware and software. In some implementations, the processor 620 may include one or more processors capable of being programmed to perform one or more operations or processes described elsewhere herein.

The memory 630 may include volatile and/or nonvolatile memory. For example, the memory 630 may include random access memory (RAM), read only memory (ROM), a hard disk drive, and/or another type of memory (e.g., a flash memory, a magnetic memory, and/or an optical memory). The memory 630 may include internal memory (e.g., RAM, ROM, or a hard disk drive) and/or removable memory (e.g., removable via a universal serial bus connection). The memory 630 may be a non-transitory computer-readable medium. The memory 630 may store information, one or more instructions, and/or software (e.g., one or more software applications) related to the operation of the device 600. In some implementations, the memory 630 may include one or more memories that are coupled (e.g., communicatively coupled) to one or more processors (e.g., processor 620), such as via the bus 610. Communicative coupling between a processor 620 and a memory 630 may enable the processor 620 to read and/or process information stored in the memory 630 and/or to store information in the memory 630.

The input component 640 may enable the device 600 to receive input, such as user input and/or sensed input. For example, the input component 640 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 650 may enable the device 600 to provide output, such as via a display, a speaker, and/or a light-emitting diode. The communication component 660 may enable the device 600 to communicate with other devices via a wired connection and/or a wireless connection. For example, the communication component 660 may include a receiver, a transmitter, a transceiver, a modem, a network interface card, and/or an antenna.

The device 600 may perform one or more operations or processes described herein. For example, a non-transitory computer-readable medium (e.g., memory 630) may store a set of instructions (e.g., one or more instructions or code) for execution by the processor 620. The processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, the processor 620 may be configured to perform one or more operations or processes described herein. Thus, implementations described herein are not limited to any specific combination of hardware circuitry and software.

The number and arrangement of components shown in FIG. 6 are provided as an example. The device 600 may include additional components, fewer components, different components, or differently arranged components than those shown in FIG. 6. Additionally, or alternatively, a set of components (e.g., one or more components) of the device 600 may perform one or more functions described as being performed by another set of components of the device 600.

Figure 7:
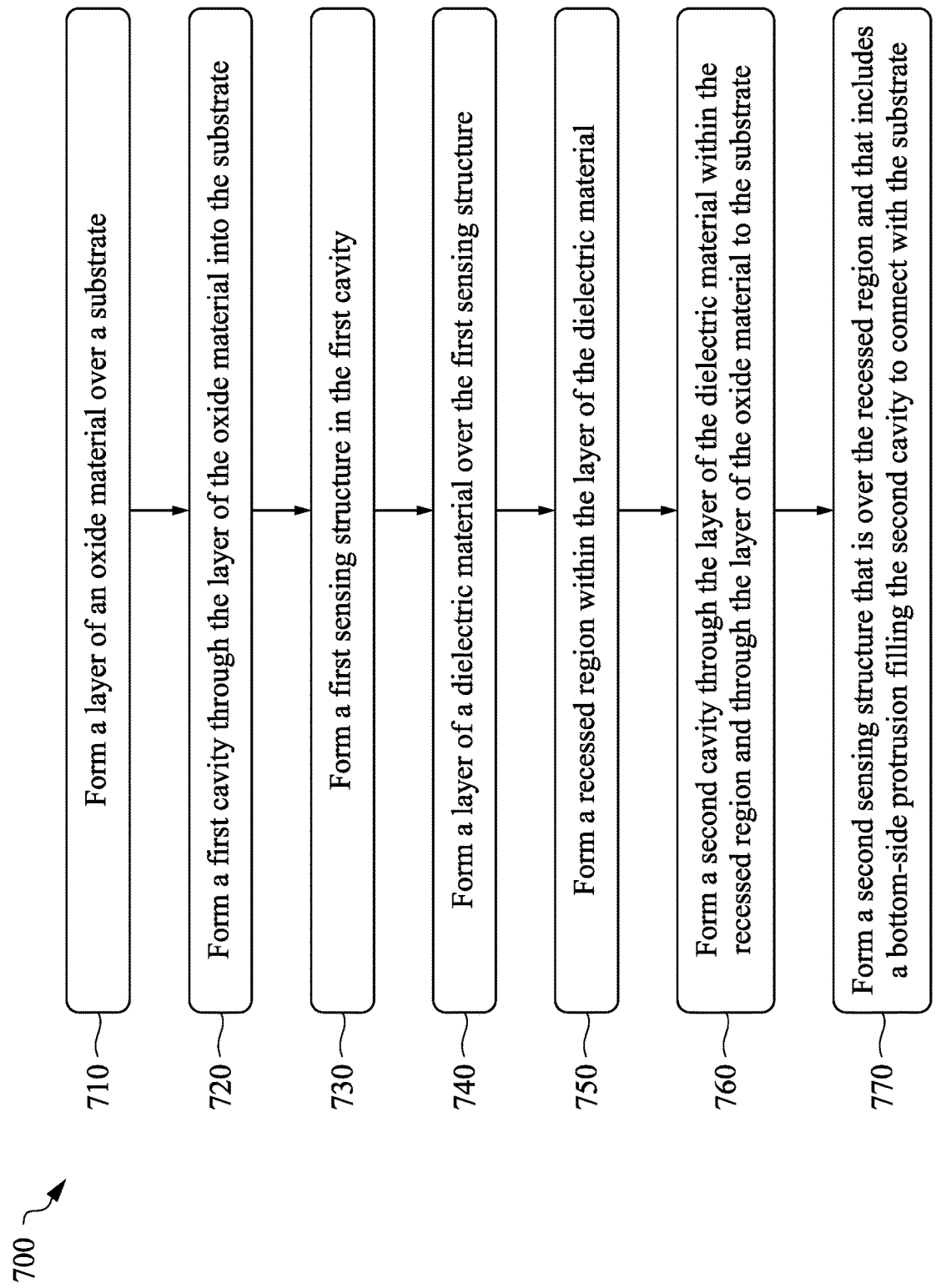
FIG. 7 is a flowchart of an example process associated with forming a multi-layer photodiode structure described herein.

FIG. 7 is a flowchart of an example process 700 associated with forming a multi-layer photodiode structure described herein. In some implementations, one or more process blocks of FIG. 7 are performed using one or more semiconductor processing tools (e.g., one or more of the semiconductor processing tools 102-116). Additionally, or alternatively, one or more process blocks of FIG. 7 may be performed using one or more components of device 600, such as processor 620, memory 630, input component 640, output component 650, and/or communication component 660.

As shown in FIG. 7, process 700 may include forming a layer of an oxide material over a substrate (block 710). For example, one or more of the semiconductor processing tools 102-116 may be used to form a layer of an oxide material (e.g., the layer of the oxide material 404) over a substrate (e.g., the substrate 312a), as described herein.

As further shown in FIG. 7, process 700 may include forming a first cavity through the layer of the oxide material into the substrate (block 720). For example, one or more of the semiconductor processing tools 102-116 may be used to form a first cavity (e.g., the cavity 502) through the layer of the oxide material into the substrate, as described herein.

As further shown in FIG. 7, process 700 may include forming a first sensing structure in the first cavity (block 730). For example, one or more of the semiconductor processing tools 102-116 may be used to form a first sensing structure (e.g., the sensing structure 316a) in the first cavity, as described herein. In some implementations, forming the first sensing structure includes forming sidewalls that are in direct contact with surfaces of the first cavity.

As further shown in FIG. 7, process 700 may include forming a layer of a dielectric material over the first sensing structure (block 740). For example, one or more of the semiconductor processing tools 102-116 may be used to form a layer of a dielectric material (e.g., the layer of the dielectric material 406a) over the first sensing structure, as described herein.

As further shown in FIG. 7, process 700 may include forming a recessed region within the layer of the dielectric material (block 750). For example, one or more of the semiconductor processing tools 102-116 may be used to form a recessed region (e.g., the region 504) within the layer of the dielectric material, as described herein.

As further shown in FIG. 7, process 700 may include forming a second cavity through the layer of the dielectric material within the recessed region and through the layer of the oxide material to the substrate (block 760). For example, one or more of the semiconductor processing tools 102-116 may be used to form a second cavity (e.g., the cavity 508) through the layer of the dielectric material within the recessed region and through the layer of the oxide material to the substrate, as described herein.

As further shown in FIG. 7, process 700 may include forming a second sensing structure that is over the recessed region and that includes a bottom-side protrusion filling the second cavity to connect with the substrate (block 770). For example, one or more of the semiconductor processing tools 102-116 may be used to form a second sensing structure (e.g., the sensing structure 316b) that is over the recessed region and that includes a bottom-side protrusion (e.g., the bottom-side protrusion 408a) filling the second cavity to connect with the substrate, as described herein. In some implementations, forming the second sensing structure includes forming the second sensing structure above the first sensing structure.

Process 700 may include additional implementations, such as any single implementation or any combination of implementations described below and/or in connection with one or more other processes described elsewhere herein.

In a first implementation, forming the first sensing structure includes epitaxially growing a type III material or a type V material in the first cavity, and planarizing the type III material or the type V material after epitaxially growing the type III material or the type V material in the first cavity.

In a second implementation, alone or in combination with the first implementation, forming the recessed region includes forming the recessed region to include a portion that extends across a boundary (e.g., the boundary 506) corresponding to an outer edge of the first sensing structure such that the recessed region overlaps the first sensing structure.

In a third implementation, alone or in combination with one or more of the first and second implementations, forming the recessed region includes forming an entirety of the recessed region to remain adjacent to a boundary (e.g., the boundary 506) corresponding to an outer edge of the first sensing structure such that no portion of the recessed region overlaps the first sensing structure.

In a fourth implementation, alone or in combination with one or more of the first through third implementations, forming the second cavity includes forming the second cavity to have a width (e.g., the width D4) that is included in a range of approximately 0.1 microns to approximately 1.0 micron, or forming the second cavity to have a depth (e.g., the depth D5) that is included in a range of approximately 0.1 microns to approximately 1.0 micron.

In a fifth implementation, alone or in combination with one or more of the first through fourth implementations, forming the second sensing structure includes epitaxially growing a type III material or a type V material in the second cavity and over the layer of the dielectric material, where epitaxially growing the type III material or the type V material is initiated within the second cavity, and planarizing the type III material or the type V material after epitaxially growing the type III material or the type V material in the second cavity and over the layer of the dielectric material.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide an optoelectronic device including a multi-layer photodiode structure having multiple sensing structures formed from one or more quantum effect materials (e.g., formed from multiple layers of quantum effect materials). The multiple sensing structures, which include sidewalls that are in contact with a substrate of the optoelectronic device, may be stacked and include overlapping portions. Through use of the multi-layer photodiode structure including the multiple sensing structures, a quantum length is increased relative to another photodiode structure including a single, planar sensing structure formed from a layer of a quantum effect material.

In this way, a performance of an optoelectronic device including the multi-layer photodiode structure is increased relative to another optoelectronic device including a photodiode structure including the single, planar sensing structure. By improving the performance of the optoelectronic device, a quality and a reliability of the optoelectronic device for a target application and/or environment may increase to improve a manufacturing yield and reduce a rate of field failures. Improving the manufacturing yield and reducing the rate of field failures may reduce an amount of resources (e.g., raw materials, semiconductor manufacturing tools, labor, and/or computing resources) needed to support a market consuming the optoelectronic device.

As described in greater detail above, some implementations described herein provide an optoelectronic device. The optoelectronic device includes a substrate. The optoelectronic device includes a multi-layer photodiode structure including a first sensing structure that extends into the substrate. The first sensing structure includes a first quantum effect material and has sidewalls that are in direct contact with the substrate. The multi-layer photodiode structure includes a second sensing structure that is above the first sensing structure and includes a second quantum effect material. The multi-layer photodiode structure includes a layer of an oxide material that is below the second sensing structure and that is above the first sensing structure. The multi-layer photodiode structure includes layer of a dielectric material that is above the layer of the oxide material and that is below the second sensing structure.

As described in greater detail above, some implementations described herein provide a device. The device includes a first semiconductor die. The first semiconductor die includes a first substrate and a pixel sensor. The pixel sensor includes a multi-layer photodiode structure that includes a first sensing structure that extends into the first substrate, a first quantum effect material, and has sidewalls that are in direct contact with the first substrate. The multi-layer photodiode structure includes a second sensing structure that is above the first sensing structure and includes a second quantum effect material. The device includes a second semiconductor die joined with the first semiconductor die below the first semiconductor die. The second semiconductor die includes a second substrate and logic integrated circuitry on or within the second substrate.

As described in greater detail above, some implementations described herein provide a method. The method includes forming a layer of an oxide material over a substrate. The method includes forming a first cavity through the layer of the oxide material into the substrate. The method includes forming a first sensing structure in the first cavity, where forming the first sensing structure includes forming sidewalls that are in direct contact with surfaces of the first cavity. The method includes forming a layer of a dielectric material over the first sensing structure. The method includes forming a recessed region within the layer of the dielectric material. The method includes forming a second cavity through the layer of the dielectric material within the recessed region and through the layer of the oxide material to the substrate. The method includes forming a second sensing structure that is over the recessed region and that includes a bottom-side protrusion filling the second cavity to connect with the substrate, where forming the second sensing structure includes forming the second sensing structure above the first sensing structure.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optoelectronic device, comprising:
   a substrate; and
   a multi-layer photodiode structure comprising:
      a first sensing structure that extends into the substrate, includes a first quantum effect material, and has sidewalls that are in direct contact with the substrate;
      a second sensing structure that is above the first sensing structure and includes a second quantum effect material;
      a layer of an oxide material that is below the second sensing structure and that is above the first sensing structure; and
      a layer of a dielectric material that is above the layer of the oxide material and that is below the second sensing structure,
      wherein the second sensing structure comprises a bottom-side protrusion that extends into the substrate.

2. The optoelectronic device of claim 1, wherein:
   the bottom-side protrusion extends downwards through the layer of the dielectric material and through the layer of the oxide material.

3. The optoelectronic device of claim 1, wherein the first quantum effect material or the second quantum effect material comprises:
   a germanium material, or
   a silicon germanium material.

4. The optoelectronic device of claim 1, wherein the optoelectronic device corresponds to:
   a frontside illumination sensor, or
   a backside illumination sensor.

5. The optoelectronic device of claim 1, wherein a ratio of a thickness of the second sensing structure to a thickness of the first sensing structure is greater than approximately 1:2.

6. The multi-layer photodiode structure of claim 1, further comprising:
   an electromagnetic wave transmissive region that is vertically arranged, includes the first sensing structure, and has a same approximate width as the first sensing structure.

7. The multi-layer photodiode structure of claim 6, wherein the second sensing structure extends laterally into the electromagnetic wave transmissive region.

8. The multi-layer photodiode structure of claim 6, wherein the second sensing structure is contained outside the electromagnetic wave transmissive region.

9. A device, comprising:
   a first semiconductor die comprising:
   a first substrate;
   a pixel sensor comprising:
   a multi-layer photodiode structure comprising:
      a first sensing structure that extends into the first substrate, includes a first quantum effect material, and has sidewalls that are in direct contact with the first substrate; and a second sensing structure that is above the first sensing structure and includes a second quantum effect material; and a second semiconductor die joined with the first semiconductor die below the first semiconductor die and comprising:

a second substrate; and logic integrated circuitry on or within the second substrate, wherein the second sensing structure comprises a bottom-side protrusion that extends into the first substrate.

10. The device of claim 9, wherein the first substrate comprises:

an oxide material, a silicon material, or a gallium arsenide material.

11. The device of claim 9, wherein the logic integrated circuitry and the multi-layer photodiode structure are electrically connected.

12. The device of claim 9, wherein the multi-layer photodiode structure further comprises:

a third sensing structure comprising a third quantum effect material and above the second sensing structure.

13. The device of claim 12, wherein the multi-layer photodiode structure further comprises:

a layer of an epitaxy material between the third sensing structure and the second sensing structure.

14. The device of claim 13, wherein the first quantum effect material, the second quantum effect material, and the third quantum effect material each comprises:

a type III material, or a type V material.

15. A method, comprising:

forming a layer of an oxide material over a substrate;

forming a first cavity through the layer of the oxide material into the substrate;

forming a first sensing structure in the first cavity, wherein forming the first sensing structure includes forming sidewalls that are in direct contact with surfaces of the first cavity;

forming a layer of a dielectric material over the first sensing structure;

forming a recessed region within the layer of the dielectric material;

forming a second cavity through the layer of the dielectric material within the recessed region, through the layer of the oxide material, and into the substrate; and forming a second sensing structure that is over the recessed region and that includes a bottom-side protrusion filling the second cavity to extend into the substrate, wherein forming the second sensing structure includes forming the second sensing structure above the first sensing structure.

16. The method of claim 15, wherein forming the first sensing structure comprises:

epitaxially growing a type III material or a type V material in the first cavity, and planarizing the type III material or the type V material after epitaxially growing the type III material or the type V material in the first cavity.

17. The method of claim 15, wherein forming the recessed region comprises:

forming the recessed region to include a portion that extends across a boundary corresponding to an outer edge of the first sensing structure such that the recessed region overlaps the first sensing structure.

18. The method of claim 15, wherein forming the recessed region comprises:

forming an entirety of the recessed region to remain adjacent to a boundary corresponding to an outer edge of the first sensing structure such that no portion of the recessed region overlaps the first sensing structure.

19. The method of claim 15, wherein forming the second cavity comprises:

forming the second cavity to have a width that is included in a range of approximately 0.1 microns to approximately 1.0 micron, or forming the second cavity to have a depth that is included in a range of approximately 0.1 microns to approximately 1.0 micron.

20. The method of claim 15, wherein forming the second sensing structure comprises:

epitaxially growing a type III material or a type V material in the second cavity and over the layer of the dielectric material, wherein epitaxially growing the type III material or the type V material is initiated within the second cavity, and planarizing the type III material or the type V material after epitaxially growing the type III material or the type V material in the second cavity and over the layer of the dielectric material.

* * * * *